United States Patent [19]

Kanauchi

[11] Patent Number: 4,806,798
[45] Date of Patent: Feb. 21, 1989

[54] OUTPUT CIRCUIT HAVING A BROAD DYNAMIC RANGE

[75] Inventor: Shushi Kanauchi, Tokyo, Japan

[73] Assignee: NEC Corporation, Tokyo, Japan

[21] Appl. No.: 73,130

[22] Filed: Jul. 14, 1987

[30] Foreign Application Priority Data

Jul. 14, 1986 [JP] Japan .................................. 61-165907

[51] Int. Cl.$^4$ .................. H03K 19/017; H03K 17/16; G06G 7/10
[52] U.S. Cl. .................................... 307/448; 307/443; 307/450; 307/473; 307/482; 307/491
[58] Field of Search ............... 307/475, 443, 448, 450, 307/473, 482, 491

[56] References Cited

U.S. PATENT DOCUMENTS 4,585,958  4/1986  Chung et al. ...................... 307/443

FOREIGN PATENT DOCUMENTS 0136726 10/1980 Japan ................................... 307/451

Primary Examiner—John S. Heyman
Assistant Examiner—M. R. Wambach
Attorney, Agent, or Firm—Sughrue, Mion, Zinn, Macpeak, and Seas

[57] ABSTRACT

In order to produce an output signal swinging its voltage level between a supply voltage level $V_{CC}$ and the ground level, there is provided a buffer circuit comprising a series combination of first and second transistors connected between a source of voltage and the ground, an output node provided between the first and second transistors, a first logic gate responsive to an input signal and a high-impedance state requesting signal and producing a first drive signal applied to the control electrode of the first transistor, a second logic gate responsive to a complementary signal of said input signal and said high-impedance state requesting signal and producing a second drive signal applied to the control electrode of the second transistor, a booster circuit operative to boost up the voltage level of the first drive signal, and a clamping circuit operative to limit the voltage level of the first drive signal at a preselected value higher than that of the source of voltage, so that the first transistor is supplied with the boosted first drive signal of the preselected level.

14 Claims, 3 Drawing Sheets

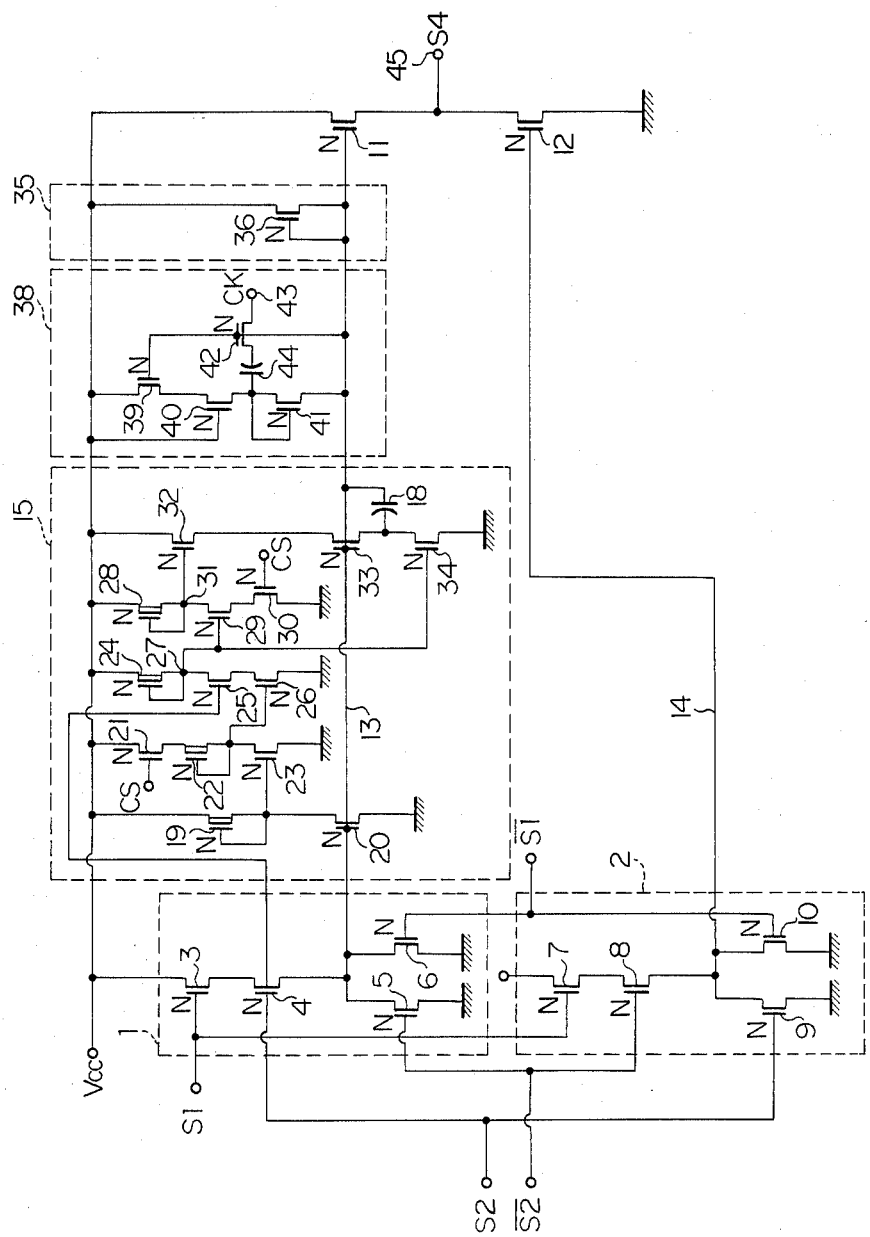

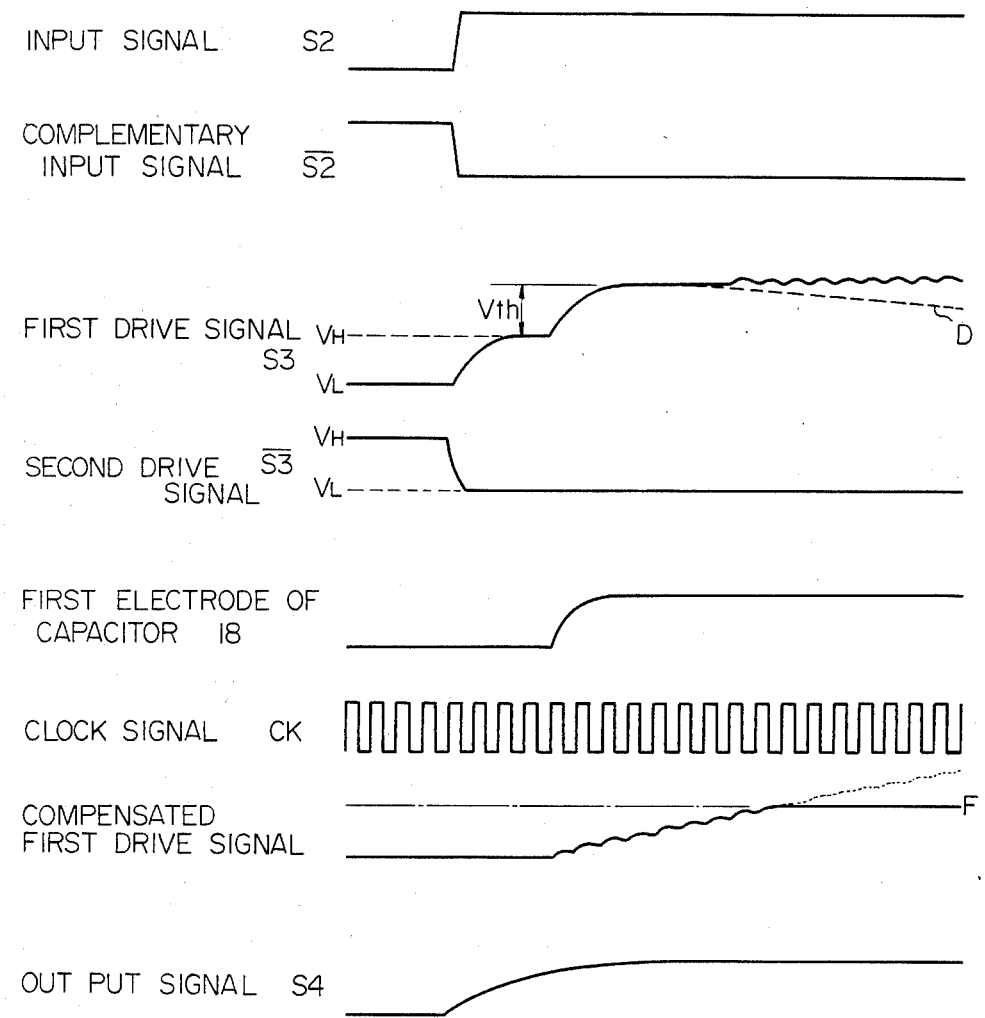

OUTPUT CIRCUIT HAVING A BROAD DYNAMIC RANGE

FIELD OF THE INVENTION

This invention relates to a buffer circuit and, more particularly, to an output buffer circuit used in a very large-scale integration.

BACKGROUND OF THE INVENTION

A known buffer circuit used in a large-scale integration consists of a series combination of two n-channel MOS (metal-oxide-semiconductor) field effect transistors which is connected between a positive voltage source producing a positive high voltage level $V_{CC}$ and the ground. The two MOS field effect transistors have respective gate electrodes applied with complementary drive signals, respectively, and each of the complementary drive signals swings its voltage level between the positive high voltage level $V_{CC}$ and the ground voltage level. With the complementary drive signals, the MOS transistors are complementarily switched between their on-states and their off-states. The prior-art buffer circuit has an output node between the two MOS field effect transistors and the output node has either high or low voltage level depending upon the voltage levels of the drive signals. Namely, one of the MOS field effect transistors turns on to provide a conduction path from the ground to the output node and the other of the MOS field effect transistors turns off to block a conduction path from the positive voltage source to the output node, then the output node has the low voltage level approximately equal to the ground voltage level. On the other hand, when the two MOS field effect transistors are complementarily switched from the on-state to off-state and vice versa, respectively, the conduction path from the positive voltage source to the output node is established but the conduction path from the ground to the output node is blocked. This results in that the output node has the high voltage level $V_{OH}$ given by $$V_{OH} = V_{CC} - V_{TH} - V_{IOUT}$$

where $V_{TH}$ is the threshold voltage of the MOS field effect transistor including the influence of a back-gate bias voltage and $V_{IOUT}$ is the value of a voltage drop due to the flow of the output current.

When the dimensions of the transistor is reduced for improving the integration density, the threshold voltage VTH of the MOS field effect transistor is increased in value under the influence of back-gate bias effect. This is because of the fact that the back-gate bias effect deteriorates when ion implantation is carried out with increased energy for improvement of the breakdown voltage. A problem is encountered in the prior-art buffer circuit in reduction of voltage amplitude at the output node. To avoid such a problem, the ion implantation to the MOS field effect transistors forming part of the buffer circuit be carried out separately from the ion implantation to the other component MOS field effect transistors. This results in increasing in lithographic process, then irregularity of the transistor's characteristics tends to take place.

SUMMARY OF THE INVENTION

It is therefore an important object of the present invention to provide a buffer circuit suitable for a very large-scale integration.

It is also an important object of the present invention to provide a buffer circuit operative to produce an output signal with a wide amplitude.

To accomplish these objects, the present invention proposes to make up a leakage current for preventing the drive signal from reduction in voltage level.

In accordance with one aspect of the present invention, there is provided a buffer circuit comprising (a) a first field effect transistor coupled between a power voltage terminal receiving a power voltage and an output terminal, (b) a second field effect transistor coupled between the output terminal and a reference voltage terminal receiving a reference voltage, (c) control means responsive to an input signal for generating a first drive signal and a second drive signal complementary to the first drive signal, each of the first and second drive signals selectively assuming a first level near the power voltage and a second level near the reference voltage, (d) means for applying the first drive signal to a gate of the first field effect transistor, (e) means for applying the second drive signal to a gate of the second field effect transistor, and (f) a leak compensation circuit coupled to the gate of the first field effect transistor for operatively raising a potential at the gate of the first field effect transistor only when the first drive signal assumes the first level.

In accordance with another aspect of the present invention, there is provided a buffer circuit comprising (a) a series combination of first and second transistors connected between a source of voltage and a ground, each of the first and second transistors having control electrodes, respectively, (b) an output node provided between the first and second transistors, (c) a first logic gate responsive to an input signal and a high-impedance state requesting signal and producing a first drive signal applied to the control electrode of the first transistor, the first logic gate causing the first transistor to forcibly turn off in the presence of the high-impedance state requesting signal, (d) a second logic gate responsive to a complementary signal of the input signal and the high-impedance state requesting signal and producing a second drive signal applied to the control electrode of the second transistor, the second logic gate causing the second transistor to forcibly turn off in the presence of the high-impedance state requesting signal, (e) booster means operative to boost up the voltage level of the first drive signal, and (f) clamping means operative to limit the voltage level of the first drive signal at a preselected value. The buffer circuit may comprise compensating means operative to make up a leakage current such as a junction leakage current of a component transistor so that the first drive signal can maintain at a preselected voltage level.

BRIEF DESCRIPTION OF THE DRAWINGS

The features and advantages of a buffer circuit according to the present invention will be more clearly understood from the following description taken in conjunction with the accompanying drawings in which:

FIG. 2 is a diagram showing the circuit arrangement of the preferred embodiment; and FIG. 3 is a graph showing waveforms of signals appearing at key nodes of the preferred embodiment.

DESCRIPTION OF THE PREFERRED EMBODIMENTS

Figure 1:
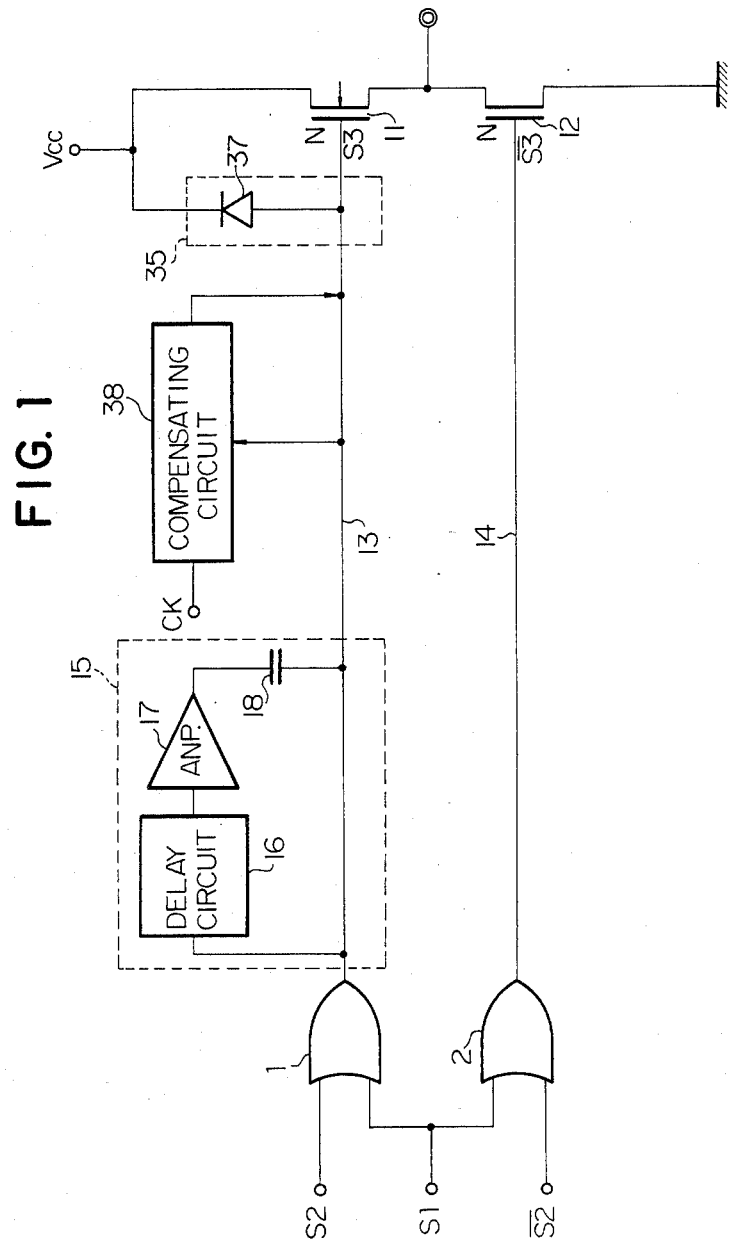
FIG. 1 is a block diagram showing the arrangement of a preferred embodiment according to the present invention.

Referring to FIG. 1 of the drawings, there is shown a buffer circuit forming part of a very large-scale integration fabricated on a semiconductor substrate (not shown). The buffer circuit largely comprises two NOR gates 1 and 2 each having two input nodes and an output node, and one of the input nodes of each NOR gate 1 or 2 is supplied with a high-impedance state requesting signal S1. The other input node of the NOR gate 1 is supplied with an input signal S2 from a logic circuit (not shown), then the input signal S2 is NORed with the high-impedance state requesting signal S1 to produce a first drive signal S3 of a high or low voltage level $V_H$ or $V_L$. On the other hand, the NOR gate 2 is supplied with a complementary input signal $\overline{S2}$ produced from the input signal S2 by an inverter circuit (not shown) and performs an NOR operation for the complementary input signal $\overline{S2}$ and the high-impedance state requesting signal S1, then a second drive signal $\overline{S3}$ produced by the NOR gate 2 is complementarily shifted between the low or high voltage level $V_L$ or $V_H$. These NOR gates 1 and 2 are shown in detail in FIG. 2 and will be described hereinunder.

Turning to FIG. 2, the NOR gate 1 comprises four enhancement-mode n-channel MOS field effect transistors 3, 4, 5 and 6. The MOS field effect transistors 3, 4 and 5 are connected in series between a voltage source supplying a positive voltage level $V_{CC}$ and a ground and the MOS field effect transistor 6 is provided in parallel to the MOS field effect transistor 5. The MOS field effect transistors 3 and 6 are supplied with the high-impedance state requesting signal S1 and a complementary signal $\overline{S1}$ produced from the high-impedance state requesting signal S1 by an inverter circuit (not shown), respectively. When the high-impedance state requesting signal S1 goes to the low voltage level, the MOS field effect transistors 3 and 6 respectively turn off and on, then supplying the output node thereof with the first drive signal of the low voltage level $V_L$ regardless of the voltage level of the input signal S2. The input signal S2 and the complementary input signal $\overline{S2}$ are applied to the MOS field effect transistors 4 and 5, respectively, so that the NOR gate 1 produces the first drive signal S3 of the high voltage level $V_H$ when the input signal S2 goes up to the high voltage level in the absence of the high-impedance state requesting signal S1 of the low voltage level. Similarly, with the complementary input signal $\overline{S2}$ of the high voltage level or the input signal S2 of the low voltage level, the NOR gate 1 produces the first drive signal S3 of the low voltage level $V_L$. The NOR gate 2 also comprises four enhancement-mode n-channel MOS field effect transistors 7, 8, 9 and 10 which are arranged to be similar in circuit arrangement to the NOR gate 1, so that the NOR gate 2 produces the second drive signal $\overline{S3}$ of the low voltage level VL regardless of the voltage level of the input signal S2 under the high-impedance state requesting signal S1 of the low voltage level but produces the second drive signal $\overline{S3}$ of the high or low voltage level $V_H$ or $V_L$ depending upon the voltage level of the input signal S2 in the absence of the high-impedance state requesting signal S1 of the low voltage level.

Turning back to FIG. 1, the buffer circuit according to the present invention further comprises a pull-up transistor 11 of an enhancement-mode n-channel MOS field effect transistor and a sink transistor 12 of an enhancement-mode n-channel MOS field effect transistor which are connected in series between the voltage source and the ground. The pull-up transistor 11 has a gate electrode connected to the output node of the NOR gate 1 through a signal propagation line 13, and, on the other hand, the sink transistor 12 has a gate electrode connected to the output node of the NOR gate 2 through a signal propagation line 14. As described above, the first and second drive signals S3 and $\overline{S3}$ are complementarily shifted between the high and low voltage levels $V_H$ and $V_L$, so that the pull-up transistor 11 and the sink transistor 12 are complementarily gated by the first and second drive signals S3 and $\overline{S3}$.

The buffer circuit according to the present invention further comprises a booster circuit 15 which has a delay circuit 16 operative to retard the transmission of the first drive signal S3 for production of a delayed first drive signal, an amplifier circuit 17 supplied with the delayed first drive signal and a capacitor 18 provided with a first electrode connected to the amplifier circuit 17 and a second electrode connected to the gate electrode of the pull-up transistor 11 through the signal propagation line 13. The booster circuit thus arranged is operative to boost up the first drive signal beyond the high voltage level $V_H$ thereof with the delayed signal applied to the first electrode of the capacitor 18 (as seen from FIG. 3).

The detailed circuit construction of the booster circuit 15 is illustrated in FIG. 2, and the booster circuit 15 illustrated in FIG. 2 comprises first, second and third logic gates connected in cascade. The first logic gate comprises a depletion-mode n-channel MOS field effect transistor 19 and an enhancement-mode n-channel MOS field effect transistor 20 connected in series between the voltage source and the ground, and the MOS field effect transistor 20 is supplied with the first drive signal S3, then the first logic gate produces the inverse of the first drive signal. The second logic gate comprises a series combination of an enhancement-mode n-channel MOS field effect transistor 21, a depletion-mode n-channel MOS field effect transistor 22 and an enhancement-mode n-channel MOS field effect transistor 23 connected between the voltage source and the ground. The MOS field effect transistor 21 is supplied with a chip select signal CS, so that the MOS field effect transistor 21 turns on or off depending upon the voltage level of the chip select signal CS to provide or cut off a conduction path from the voltage source. The MOS field effect transistor 23 is supplied with the output signal of the first logic gate, then the second logic gate produces the inverse of the output signal of the first logic gate in the presence of the chip select signal of the active high level. Similarly, the third logic gate comprises a depletion-mode n-channel MOS field effect transistor 24 and two enhancement-mode n-channel MOS field effect transistors 25 and 26 connected in series between the voltage source and the ground. The MOS field effect transistors 25 and 26 are supplied with the first drive signal S3 and the output signal of the second logic gate, respectively. The output signal of the second logic gate follows the first drive signal S3 so that the third logic gate produces the inverse of the output signal of the second logic gate. The first drive signal S3 is inverted three times by the first, second and third logic gates each of which can retard the transmission of the signal, then a delayed first drive signal appears at the output node 27. The booster circuit 15 further comprises a series combination of a depletion-mode n-channel MOS field effect transistor 28 and two enhancement-mode n-channel MOS field effect transistors 29 and 30 connected between the voltage source and the ground. The MOS field effect transistor 30 is gated by the chip select signal CS so that the series combination is activated in the presence of the chip select signal CS of the high voltage level. The MOS field effect transistor 29 is coupled to the output node 27 so that the MOS field effect transistor 29 turns on or off depending upon the voltage level of the output node 27 to change the voltage level at an output node 31 between the high and low voltage level. Between the voltage source and the ground is connected a series combination of three enhancement-mode n-channel MOS field effect transistors 32, 33 and 34 which has a large current driving capability so that this series combination serves as a current amplifier circuit. The MOS field effect transistor 32 is gated by the output node 31 so that a conduction path provided by the MOS field effect transistors 32 to 34 is blocked before appearance of the delayed first drive signal S3 at the output node 27. The MOS field effect transistors 33 and 34 are supplied with the first drive signal S3 and the delayed first drive signal, respectively, and the capacitor 18 is connected between the drain node of the MOS field effect transistor 34 and the gate electrode of the MOS field effect transistor 33. The capacitor 18 thus connected is supplied with the first drive signal S3 at the second electrode thereof and, thereafter, the delayed first drive signal is supplied from the output node 27 to the first electrode of the capacitor 18, then the first drive signal S3 is boosted up beyond the high voltage level $V_H$.

Referring to FIG. 1 again, the buffer circuit according to the present invention further comprises a clamping circuit 35 operative to limit the voltage level of the boosted first drive signal S3 at a preselected value F higher than the positive voltage level $V_{CC}$ than a threshold voltage value Vth. In this instance, the clamping circuit 35 comprises an enhancement-mode n-channel MOS field effect transistor 36 connected between the voltage source and the signal propagation line 13 as will be seen from FIG. 2. The MOS field effect transistor 36 has a gate electrode connected to the signal propagation line 13 so that the MOS field effect transistor 36 provides a conduction path when the boosted first drive signal S3 is higher in voltage level than the voltage source by a threshold voltage thereof. In this instance, the buffer circuit forms part of the very large-scale integration fabricated on the single semiconductor substrate through a series of fabrication steps, so that the MOS field effect transistor 36 is formed concurrently with the other component MOS field effect transistors. This results in that the MOS field effect transistor 36 has the threshold voltage approximately equal to that of the MOS field effect transistor 11. Then, the first drive signal S3 is clamped at the preselected value F. In other words, the MOS field effect transistor 36 serves as a clamping diode 37 as illustrated in FIG. 1.

The buffer circuit according to the present invention further comprises a compensating circuit 38 operative to make up a leakage current from the signal propagation line 13 after the first drive signal S3 is boosted up. If the buffer circuit is not provided with the compensating circuit 38, the boosted first drive signal S3 goes down toward the ground level (which is indicated by a dotted line D in FIG. 3) due to a leakage current such as a junction leakage current of the MOS field effect transistor 11. However, the buffer circuit illustrated in FIG. 1 has the compensating circuit 38 so that the boosted first drive signal S3 is not decreased in voltage level with time. Turning to FIG. 2, the detailed circuit arrangement of the compensating circuit 38 is illustrated. The compensating circuit 38 comprises a series combination of three enhancement-mode n-channel MOS field effect transistors 39, 40 and 41 connected between the voltage source and the signal propagation line 13, an enhancement-mode n-channel MOS field effect transistor 42 supplied with a clock signal CK appearing at a clock node 43, and a capacitor provided between the MOS field effect transistor 42 and the series combination of MOS field effect transistors 39 to 41. The MOS field effect transistors 39 and 42 are gated by the signal propagation line 13 so that the compensating circuit 38 is activated when the signal propagation line 13 exceeds the high voltage level $V_H$ by a threshold voltage of the MOS field effect transistor 39. If the boosted first drive signal S3 goes down from the preselected value F, the MOS field effect transistor 41 makes up the leakage current in synchronous to the clock signal CK.

The buffer circuit thus arranged is operative to produce an output signal S4 appearing at an output node 45 and the output signal S4 changes the voltage level between the positive voltage level $V_{CC}$ and the ground level because the pull-up transistor 11 is driven by the boosted first drive signal S3 with the preselected level F which is higher than the positive voltage level $V_{CC}$ by the threshold voltage Vth of the pull-up transistor.

Although particular embodiment of the present invention have been shown and described, it will be obvious to those skilled in the art that various changes and modifications may be made without departing from the spirit and scope of the present invention.

What is claimed is:

1. A buffer circuit comprising:
   (a) a series combination of first and second transistors connected between a source of voltage and a ground, each of the first and second transistors having control electrodes respectively said first transistor being identical in conductivity type with said second transistor;
   (b) an output node provided between said first and second transistors;
   (c) a first logic gate responsive to an input signal and a high-impedance state requesting signal and producing a first drive signal applied to the control electrode of said first transistor, said first logic gate causing said first transistor to forcibly turn off in the presence of said high-impedance state requesting signal;
   (d) a second logic gate responsive to a complementary signal of said input signal and said high-impedance state requesting signal and producing a second drive signal applied to the control electrode of said second transistor, said second logic gate causing said second transistor to forcibly turn off in the presence of said high-impedance state requesting signal;
   (e) booster means coupled to the control electrode of said first transistor and operative to boost up the voltage level of said first drive signal to a voltage level higher than that of said source of voltage, thereby allowing said first transistor to turn-on in a non-saturated region; and (f) clamping means coupled to the control electrode of said first transistor and operative to limit the voltage level of said first drive signal at a preselected value larger than that of a voltage level supped from said source of voltage.

2. A buffer circuit as set forth in claim 1, in which said preselected value is larger than the voltage level supplied from said source of voltage by a threshold voltage of said first transistor.

3. A buffer circuit as set forth in claim 1, in which each of said first and second logic gates performs an NOR function.

4. A buffer circuit as set forth in claim 1, in which said booster means comprise a delay circuit operative to transmit said first drive signal and introduce a preselected delay in the transmission of said first drive signal for producing a delayed first drive signal, and a capacitor having a first electrode supplied with the delayed first drive signal and a second electrode connected to the control electrode of said first transistor.

5. A buffer circuit as set forth in claim 4, in which said delay circuit comprises an odd number of logic gates connected in cascade.

6. A buffer circuit as set forth in claim 4, in which said booster means further comprise an amplifier circuit connected between said delay circuit and said capacitor.

7. A buffer circuit as set forth in claim 1, in which said clamping means comprise a diode having an anode connected to the control electrode of said first transistor and a cathode connected to said source of voltage.

8. A buffer circuit as set forth in claim 1, in which said buffer circuit, further comprises compensating means operative to compensate a leakage current so as to maintain said first drive signal at the preselected value.

9. A buffer circuit as set forth in claim 8, in which said compensating means comprises a third transistor having a drain node supplied with a clock signal and a gate electrode connected to the control electrode of said first transistor, a fourth transistor having a drain node capacitively coupled to a source node of the third transistor, a gate electrode connected to the drain node thereof and a source node connected to the control electrode of said first transistor, a fifth transistor having a source node capacitively coupled to the source node of the third transistor and a gate electrode connected to said source of voltage, and a sixth transistor having a source node connected to a drain node of the fifth transistor, a gate electrode connected to the control electrode of said first transistor and a drain node connected to said source of voltage.

10. A buffer circuit comprising:
(a) a series combination of first and second enhancement-mode n-channel filed effect transistors connected between a source of voltage and a ground, each of the first and second enhancement-mode n-channel field effect transistors having control electrodes, respectively;
(b) an output node provided between said first and second enhancement-mode n-channel field effect transistor;
(c) a first NOR gate responsive to an input signal and a high-impendance state requesting signal and producing a first drive signal applied to the control electrode of said first enhancement-mode n-channel field effect transistor;
(d) a second NOR gate responsive to a complementary signal of said input signal and said high-impedance state requesting signal and producing a second drive signal applied to the control electrode of said second enhancement-mode n-channel field effect transistor;
(e) a booster circuit coupled to the control electrode of said first enhancement-mode n-channel field effect transistor, said booster circuit having an odd number of logic gates operative to transmit said first drive signal and introduce a preselected delay in the transmission of the first drive signal for producing a delayed first drive signal, and a capacitor having a first electrode supplied with the delayed first drive signal and a second electrode connected to the control electrode of said first enhancement-mode n-channel field effect transistor, said booster circuit being operative to boost up the voltage level of said first drive signal to a voltage level higher than that of said source of voltage, thereby allowing said first transistor to operate in a non-saturation region;
(f) a clamping circuit having an enhancement-mode n-channel field effect transistor connected between said source of voltage and the control electrode of said first enhancement-mode n-channel field effect transistor and provided with a control electrode connected to the control electrode of said first enhancement-mode n-channel field effect transistor, said clamping circuit being operative to limit the voltage level of said first drive signal at a preselected value larger than that of the voltage level supplied from said source of voltage; and
(g) a compensating circuit comprising a third transistor having a drain node supplied with a clock signal and a gate electrode connected to the control electrode of said first transistor, a fourth transistor having a drain node capacitively coupled to a source node of the third transistor, a gate electrode connected to the drain node thereof and a source node connected to the control electrode of said first transistor, a fifth transistor having source node capacitively coupled to the source node of the third transistor and a gate electrode connected to said source of voltage, and sixth transistor having a source node connected to a drain node of the fifth transistor, a gate electrode connected to the control electrode of said first transistor and a drain node connected to said source of voltage, said compensating circuit being operative to compensate a leakage current so as to maintain said first drive signal at said preselected value.

11. A buffer circuit comprising:
(a) a first field effect transistor coupled between a power voltage terminal receiving a power voltage and an output terminal;
(b) a second field effect transistor coupled between said output terminal and a reference voltage terminal receiving a reference voltage, said first field effect transistor being identical in conductivity type with said second field effect transistor;
(c) control means responsive to an input signal for generating a first drive signal and a second drive signal complementary to the first drive signal, each of said first and second drive signals selectively assuming a first level near said power voltage and a second level near said reference voltage;

(d) means for applying said first drive signal to a gate of said first field effect transistor;

(e) means for applying said second drive signal to a gate of said second field effect transistor; and (f) a leak compensation circuit coupled to the gate of said first field effect transistor for operatively raising a potential at the gate of the first field effect transistor to a voltage higher than said power voltage only when the first drive signal assumes the first level.

12. A buffer circuit as set forth in claim 11, in which said lead compensation circuit comprises a series combination of third, fourth and fifth field effect transistors coupled between said power voltage terminal and the gate of said first field effect transistor, and a series combination of a sixth field effect transistor and a capacitor coupled between a clock terminal and a node between said fourth and fifth field effect transistors, said third and sixth field effect transistors having respective gates coupled to the gate of said first field effect transistor, said fourth and fifth field effect transistor having respective gates coupled to said power voltage terminal and said node, respectively, wherein a clock signal is applied to said clock terminal when said first drive signal assumes the first level.

13. A buffer circuit as set forth in claim 11, in which said control means comprises a booster circuit operative to boost up the voltage level of said first drive signal.

14. A buffer circuit as set forth in claim 11, in which said buffer circuit further comprises a clamping diode operative to limit the voltage level of said first drive signal at said first level.

* * * * *

UNITED STATES PATENT AND TRADEMARK OFFICE
CERTIFICATE OF CORRECTION

PATENT NO. : 4,806,798
DATED : February 21, 1989
INVENTOR(S) : SHUSHI KANAUCHI

It is certified that error appears in the above-identified patent and that said Letters Patent is hereby corrected as shown below:

Col. 1, line 54, delete "VTH" and insert $-- V_{TH} --$.

Col. 3, line 24, delete "S2" and insert $-- \overline{S2} --$.

Signed and Sealed this

Twenty-sixth Day of December, 1989

Attest:

JEFFREY M. SAMUELS

Attesting Officer     Acting Commissioner of Patents and Trademarks